US006170603B1

(12) United States Patent
Bachmann et al.

(10) Patent No.: US 6,170,603 B1
(45) Date of Patent: Jan. 9, 2001

(54) ACOUSTIC WALL

(75) Inventors: Wolfgang Bachmann, Grevenbroich; Gerhard Krump, Schwarzach; Hans-Juergen Regl, Duesseldorf, all of (DE)

(73) Assignee: Harman Audio Electronic Systems GmbH, Straubing (DE)

( * ) Notice: Under 35 U.S.C. 154(b), the term of this patent shall be extended for 0 days.

(21) Appl. No.: 09/390,058

(22) Filed: Sep. 3, 1999

(30) Foreign Application Priority Data

Sep. 4, 1998 (DE) ... 198 40 375

(51) Int. Cl.[7] ... H05K 5/00
(52) U.S. Cl. ... 181/150; 181/173; 381/431
(58) Field of Search ... 181/173, 174, 181/171, 141, 150, 199; 381/423, 424, 431, 430, 426

(56) References Cited

U.S. PATENT DOCUMENTS

| | | | | |
|---|---|---|---|---|
| 3,696,885 | * | 10/1972 | Grieg et al. | 181/199 |
| 4,778,027 | * | 10/1988 | Taylor | 181/141 |
| 4,928,312 | * | 5/1990 | Hill | 381/431 |
| 5,693,917 | * | 12/1997 | Bertagni et al. | 181/173 |

FOREIGN PATENT DOCUMENTS

| | | |
|---|---|---|
| 197 57 097 A1 | 12/1997 | (DE) . |
| 95301127 | 1/1995 | (EP) . |
| 95304427 | 6/1995 | (EP) . |

* cited by examiner

*Primary Examiner*—Khanh Dang
(74) *Attorney, Agent, or Firm*—Foley, Hoag & Eliot LLP

(57) ABSTRACT

The invention relates to acoustic walls for large public events. Traditionally, sound is reproduced by using a plurality of large and heavy loudspeaker boxes which requires a complicated and expensive support system. The present invention provides a segmented acoustic wall which has an essentially flat shape and is also extremely lightweight. Several of these segments can be integrated to form an acoustic wall by coupling the different segments with one another, whereby the entire surface area of the acoustic wall can be used to radiate sound without requiring additional sound sources in the audience space. The various segments can be optimized for certain frequency ranges by tuning the surface area and depth of the respective segments to the respective transmitted frequencies. Several acoustic walls can be placed side-by-side to flexibly conform to different requirements in the audience space. In addition, the reproduction planes of the acoustic walls facing the audience space can be used, for example, to support advertisements in printed form.

16 Claims, 4 Drawing Sheets

ACOUSTIC WALL

FIELD OF THE INVENTION

The invention relates to acoustic walls, in particular to acoustic walls suitable for providing sound for large public events.

BACKGROUND OF THE INVENTION

To produce a sufficiently large sound volume in an audience space of large public events, it is necessary to place a large number of conventional loudspeaker boxes. Because of the high transmitted power, these loudspeaker boxes must have rigid and often quite large housings, requiring extensive scaffolding to which these boxes can be securely attached. This expense may be justifiable for stationary installations with a long lifetime. Even though, the combined loudspeaker boxes have a large footprint and use a large amount of space, which is increasingly viewed as a considerable disadvantage.

Furthermore, such a combined loudspeaker system is particularly disadvantageous if the loudspeaker boxes are used only for a one-time music event, such as an open-air concert, since placing the acoustic system requires extensive preparations which can be expensive. Moreover, conventional loudspeaker systems tend to be quite complex in order to provide the considerable amount of power required for reproducing the low-frequency (bass) sound, which is particularly desirable for large events. This is typically realized with large and heavy woofer systems, which in spite of their cost are often not able to adequately reproduce the sound in every situation. This is due to the fact that the conventional bass speakers (woofers) require a larger membrane area and/or stroke for improving the reproduction of low-frequency sound, which may exceed the operational stability limit of the speaker. It is therefore an object of the present invention to provide an acoustic system for large events which can be easily and inexpensively adapted to the respective conditions and installed at the location of the event, and which is able to reproduce low-frequency sound with high quality.

SUMMARY OF THE INVENTION

According to one aspect of the invention, an acoustic wall provides a compact, space-saving and lightweight arrangement for reproducing sound, wherein at least one segment radiates acoustic waves from the reproduction plane of the acoustic wall. This arrangement reduces the required area and space to the size of the respective acoustic wall. Moreover, this arrangement can be adapted to the respective actual conditions and expanded by placing additional acoustic walls side-by-side. According to the invention, acoustic walls can also reproduce bass sound with excellent quality, since segments formed as bass plates having marginal edges, which are only approximately 2.30 m long, can radiate frequencies close to the audible limit with considerable sound pressure.

According to one embodiment, the respective segments of an acoustic wall are coupled to one another at their respective marginal edges with coupling elements. The different segments of a acoustic wall can then operate as so-called range radiators optimized for a limited frequency range. In addition, different segments may be connected with one another, with connecting elements installed at specified locations. The connecting elements provide or operate as a mechanical filter, so that the mutual interaction between these segments enhances the effect of individual segments.

According to another embodiment, a coupled connection between the segments can be easily provided when the segments consist of a core layer and at least one cover layer. In this case, the respective connection between the segments can be provided by the cover layer(s) and/or the core layer, in that the respective cover layer and/or the core layer also bridges the marginal gaps between adjacent segments. The core layer may advantageously be used to connect with one another a plurality of segments by segmenting the respective core layer through respective milled recesses, wherein the regions of the core layer weakened by the milled recesses can be used as coupling connections.

According to another embodiment, the segments and the sound radiating segments, respectively, integrated in the acoustic wall do not necessarily have to occupy the same area in the sound reproduction plane of the acoustic wall. Through a suitably selected shape and association of the segments, the respective acoustic wall can be designed to reproduce the sound quite flexibly.

Placing those segments which are optimized for reproducing low frequencies, mainly in the center region of the acoustic wall significantly improves the bass reproduction, since the segments and portions of the acoustic wall abutting the segments provided for bass reproduction can in the present configuration also be used to reduce the dipole short circuit.

According to yet another embodiment, the sound reproduction can be further optimized by making the sound reproduction segments of the acoustic wall which are designed to optimally reproduce a predetermined frequency range, of different depth perpendicular to the reproduction plane. It has been experimentally observed that the bass reproduction is of particularly high quality when the respective bass segment has a depth which is comparably smaller than the depth of the mid-tone and high-tone segments.

According to still another embodiment, the respective sound radiating segment is provided with at least one recess which in certain areas reduces the thickness of the core layer perpendicular to its surface normal. With this arrangement, the low-frequency resonances of the sound radiating segment are split into a plurality of weaker, mutually detuned resonances, thereby increasing the density of the natural frequencies and the resonances. It should also be mentioned these recesses can be used with an acoustic wall having several sound radiating segments as well as with individually placed sound radiating segments.

By having the sound reproduction planes of the acoustic walls of the invention which form substantially flat or slightly curved surfaces, face the audience, the shape of these surfaces can be selected to provide support for advertising material, such as lettering or prints.

Further features and advantages of the present invention will be apparent from the following description of preferred embodiments and from the claims.

PREFERRED EMBODIMENTS OF THE INVENTION

Figure 1:
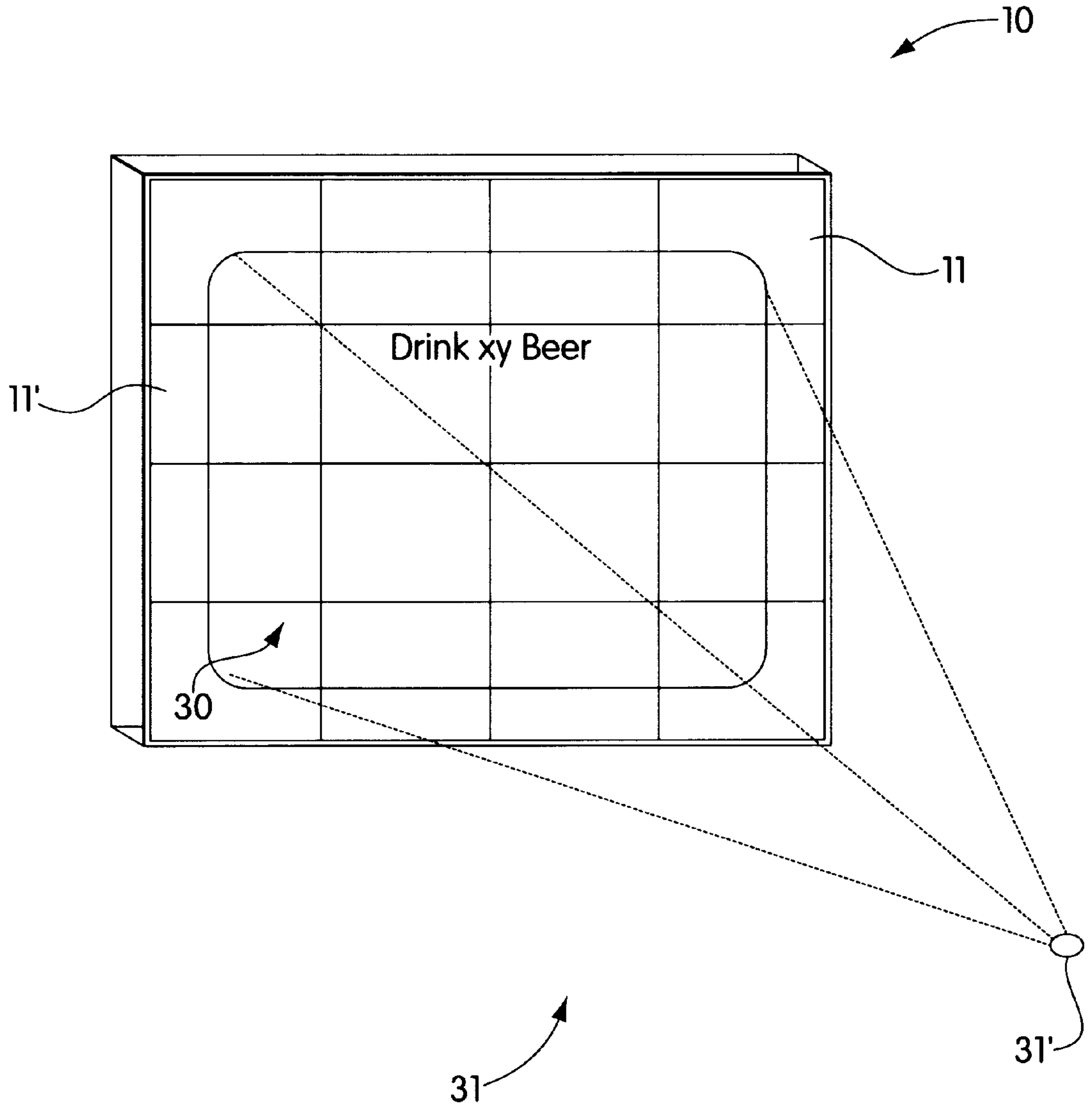
FIG. 1 shows a perspective view of an acoustic wall according to the present invention.

Referring now to FIG. 1, an acoustic wall 10 is formed using a plurality of segments 11. A reproduction plane 30 which is formed by the segments 11 and faces an audience space 31, is provided with a visually recognizable design 12 in the form of an advertisement.

As shown in FIG. 1, each segment 11 is formed as a sound radiating segment 11'. As discussed in connection with DE-A-19757097.6 which relates to the subject matter of the present invention, each sound radiating segment 11' is formed by a lightweight core layer 13 (FIG. 3(*a*)) and at least one cover layer 14 (FIG. 3(*a*)), wherein the respective cover layers 14 consist of a material with a particularly high velocity for longitudinal waves and are connected with those surfaces of the core layer 13 which have the largest surface area. This embodiment is relatively lightweight and has a very small depth with respect to the surface normal. It should be mentioned that the respective sound radiating segments 11' can be provided with, for example, electrodynamic transducers which produce bending waves, depending on the excitation of the sound radiating segments 11'. Further details are described in the above-referenced patent.

It should also be pointed out with reference to FIG. 1, that the acoustic wall 10 shown in FIG. 1 has a completely planar structure. The invention, however, is not limited to this structure. For example, according to another embodiment, the acoustic wall 10 and its reproduction plane 30, respectively, may be formed at least partially convex or concave in relation to a fixed point 31' located in the audience space 31.

Although the entire acoustic wall 10 illustrated in FIG. 1 may have sound radiating segments 11', according to another embodiment (not shown), segments 11 which are not themselves implemented as sound radiating segments 11', may be integrated in the acoustic wall 10. Such (blind) segments 11 can be used to secure and support the protection walls 10 at the respective installation location.

Figure 2:
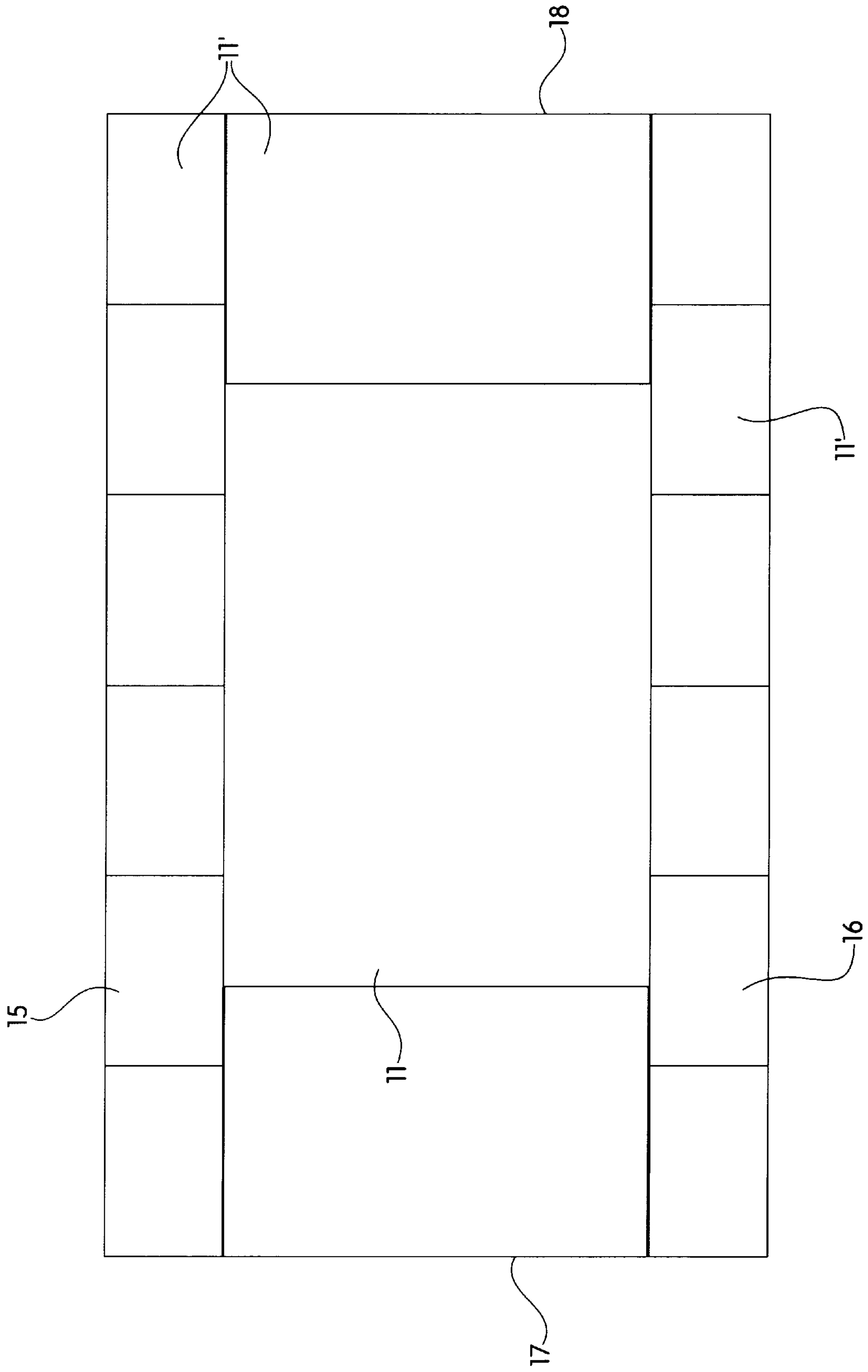
FIG. 2 shows a top view of the acoustic wall according to the present invention.
Figure 3A:
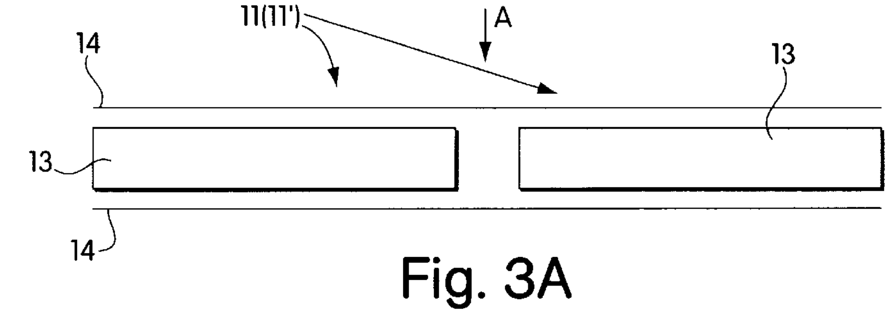
FIGS. 3(*a*)–(*e*) show five connections between segments of the acoustic wall according to the present invention.
Figure 3B:
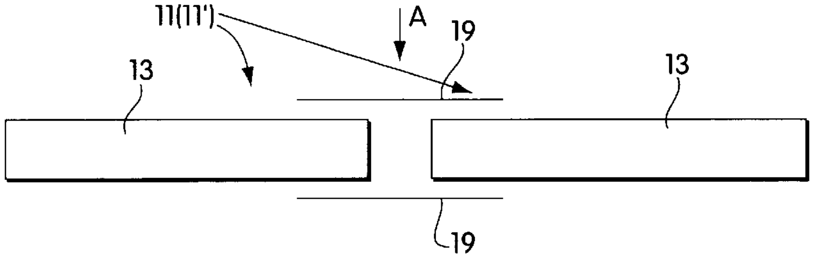
Figure 3C:
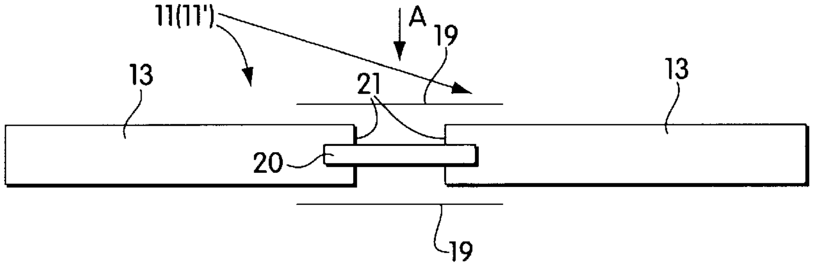
Figure 3D:
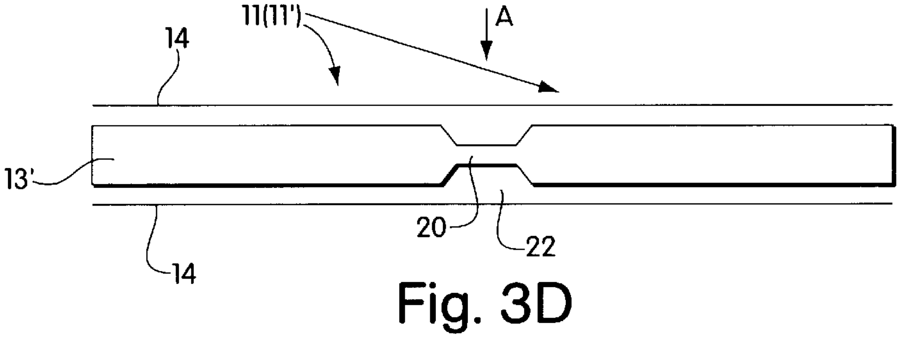
Figure 3E:
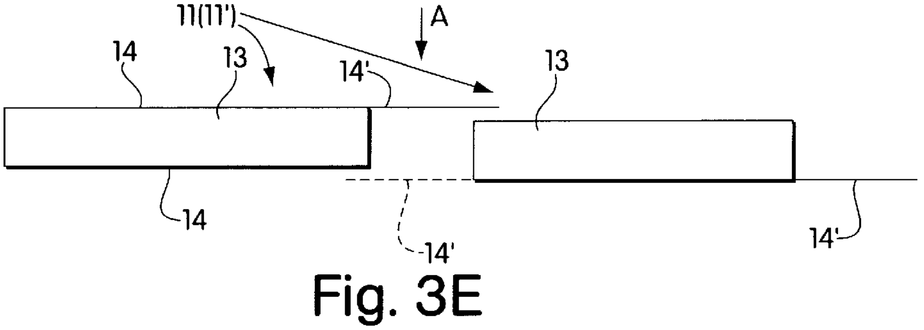

A second embodiment illustrated in FIG. 2 shows an acoustic wall 10, wherein all segments 11 are implemented as sound radiating segments 11'. Unlike the embodiment of FIG. 1, however, the different sound radiating segments 11' of FIG. 2 have different surface areas in the reproduction plane 30. The sound radiating segment 11', which is by far the largest segment, is located in the center region of the acoustic wall 10. This sound reproducing segment 11' is optimized for reproducing low-frequency sound. On the upper and lower margin 15, 16 of the acoustic wall, there is provided a respective row of six sound radiating segments 11', each of which has the smallest surface area in the reproduction plane 30 and is used for radiating high-frequency sound.

On lateral edges 17, 18 of the acoustic wall 10, there is provided a respective sound radiating segment 11' which has a surface area with an intermediate size—between that of the two aforedescribed sound radiating segments 11'—for reproducing mid-frequency sound. It should be mentioned that for reproducing low-frequency (bass) sound, the sound radiating segment 11' does not necessarily need to be located in the center of the acoustic wall 10. In particular, according to another embodiment (not shown) for reproducing low-frequency sound, the center region of a acoustic wall 10 or the entire acoustic wall may have a plurality of sound radiating segments 11' which are not necessarily arranged symmetrically with respect to each other. In this embodiment, too, the bass segment or segments 11' should be surrounded by other segments 11 or 11' to prevent acoustic short circuits. For the same reason, the bass segment or segments 11' should be connected with at least the immediately adjacent segments 11, 11' through connecting elements 19, 20 which are impervious to sound waves.

Details of the connection between the (blind) segments and sound radiating segments 11', respectively, are shown in FIGS. 3(*a*) to 3(*e*).

FIG. 3(*a*) shows two core layers 13 arranged side-by-side and separated by a gap A. The two surfaces of the two illustrated core layers 13 which have the largest area, are each connected with a cover layer 14. Since the upper and lower cover layer 14 for the two segments 11 (11') shown in FIG. 3(*a*) is formed as a common cover layer 14, these cover layers 14 at the same time also cover the gap A separating the two segments 11 (11'). In order to more clearly illustrate the situation, the two cover layers 14 are shown as having a small separation from the respective surfaces of the core layers 13.

As will be discussed below in more detail, the gap A between the individual segments 11 (11') as well as the materials used to bridge the gap A have a significant impact on the particulars of the connection between the segments 11 (11'). This is because the cover layers 14 used to connect the segments with one another and/or the individual connecting elements 19, 20 can operate as mechanical filters due to their mechanical spring-mass damping properties and can also be used to specifically optimize and/or influence the sound radiating properties of adjacent sound radiating segments 11'.

FIG. 3(*b*) shows two core layers 13, which are each already provided with one or two cover layers 14 (not shown in FIG. 3(*b*)). To cover the gap A between the segments 11 (11') and to provide a coupled connection, two strips 19 are provided which can be attached to the cover layers 14 of the core layers 13, for example with an adhesive.

In another embodiment (now shown), the two strips 19 used to connect the two segments 11 (11') can also be glued directly to the core layers 13, i.e., before the cover layers 14 are applied. In this case, as already discussed in connection with FIG. 3(*a*), the two cover layers 14 of the two core layers 13 can be formed continuously, so that in this case the respective connection between the two segments 11 (11') consists of a strip 19 and a cover layer 14 covering the strip 19.

If the surface in the embodiment illustrated in FIG. 3(*b*) is intended to have a uniform appearance, then the strips 19 can also be inserted into recesses (not shown) which are adapted to the thickness of the strips 19 and located in the core layers 13.

The embodiment shown in FIG. 3(*c*) is different from that of FIG. 3(*b*) only in that the narrow edges 21 of the two core layers 13 are also connected to a connecting element 20. When the narrow edges 21 are connected in this fashion, the strips 19 do not only provide a uniform surface appearance between two segments 11 (11'), but also determine the cooperation with the connecting element 20 by selecting the desired coupling strength between the two segments 11 (11').

FIG. 3(*d*) shows a uniform core layer region 13' for the two segments 11 (11'). In areas where the other core layers 13 shown in FIG. 3(*a*) to 3(*c*) are separated by a lateral gap A, this core layer region 13' has two trapezoidal milled recesses 22 which weaken the thickness of the core layer region 13', which is the same for the two segments 11 (11'), thereby in effect separating the two regions. As a result, the portion remaining between the two segments 11 (11') operates also as a connecting element 20, similar to the embodiment of FIG. 3(*c*). To provide a uniform surface appearance, the two segments 11 (11') can also be provided with cover layers 14 covering the milled recesses 22.

FIG. 3(*e*) shows another embodiment of a connection between two (blind) segments 11 and sound radiating segments 11', respectively. Again, both sides of the two core layers 13 are provided with cover layers 14. The two segments 11 (11') can be connected by having a region 14' of one of the cover layers 14 protrude over the narrow sides 21 of the core layer 13. These protruding regions 14' of the cover layers 14 can be used, as shown in FIG. 3(*e*), for providing a connection between two segments 11 (11'), whereby the protruding region 14' of one of the segments 11 (11') is connected to the cover layer 14 of the other segment 11 (11'). When the segments 11 (11') are formed as shown in FIG. 3(*a*), the segments 11 (11') formed of the core layer 13 and the cover layers 14 can advantageously be fabricated by a simple process in large numbers and easily connected with each other via the protruding regions 14'. If for visual or acoustic effects, two segments 11 (11') are to be connected on both sides of the gap A, then the respective segment 11 (11') may also have two protruding regions 14'. The latter case is illustrated for the right-hand segment 11 (11') by a dashed line.

Returning to FIG. 3(*a*) to 3(*e*), the illustrated connections between two segments 11 (11') should be impervious to sound at least in those cases where one of the segments 11 (11') is connected to a sound radiating segment 11' used to reproduce low-frequency sound, since only connections that arc impervious to sound can prevent acoustic short circuits.

Figure 4:
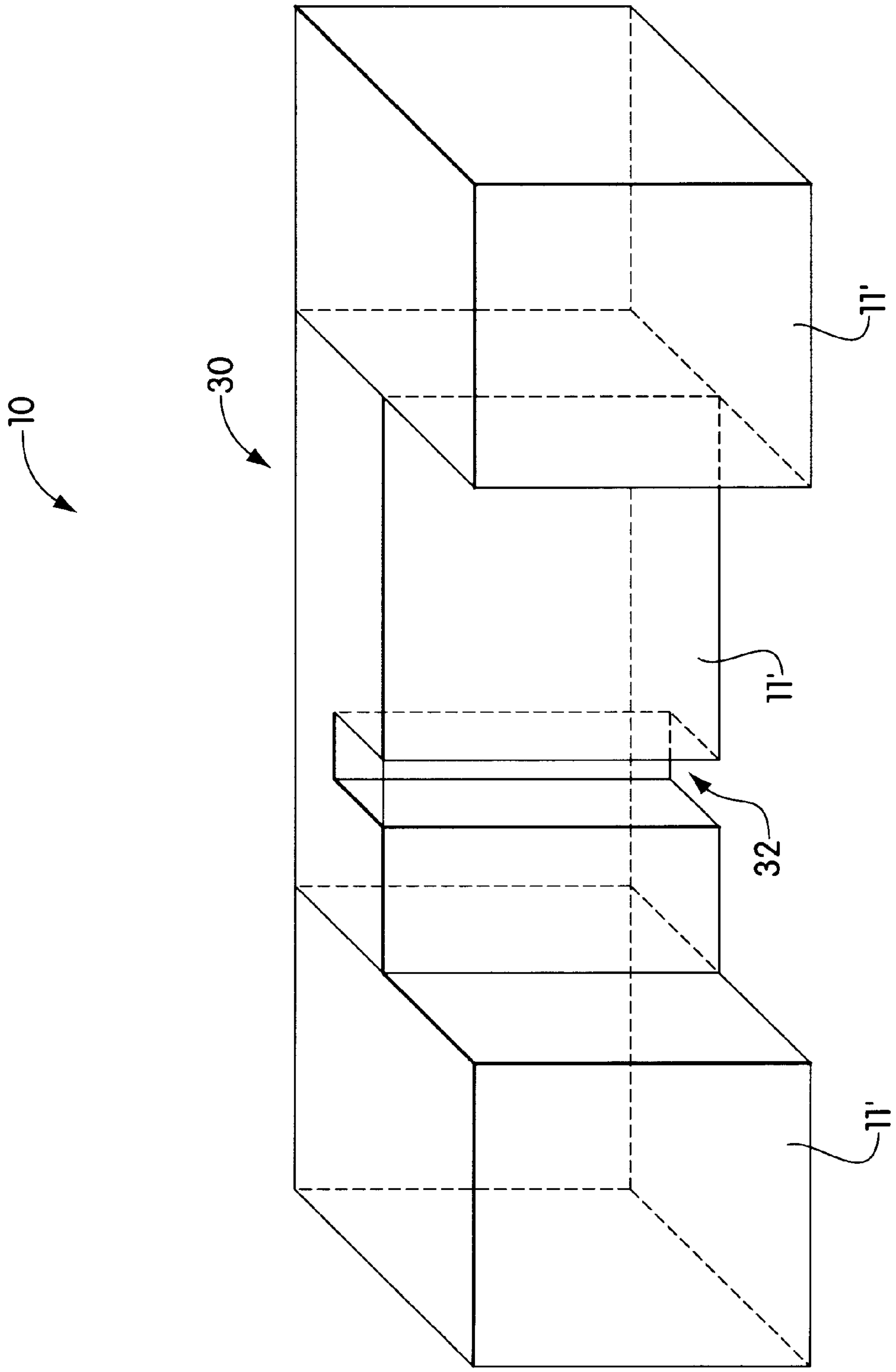
FIG. 4 shows the back side of the acoustic wall according to the present invention.

FIG. 4 shows a rear view of an acoustic wall 10 formed of three sound radiating segments 11'. As seen from FIG. 4, the various sound radiating segments 11' not only have different surface areas, as discussed above with reference to FIG. 2, but also different depths perpendicular to the reproduction plane 30 of the acoustic wall 10. Sound radiating segments 11' of different depths are used to optimize the sound reproduction of certain regions of the acoustic wall 10. If, as shown in FIG. 4, the different sound radiating segments 11' are combined in such a way that the different depths of the sound radiating segments 11' are visible only on the rearward side of the acoustic wall 10, then the front surface of the acoustic wall 10, which is not visible in FIG. 4, remains intact as a smooth reproduction plane 30.

In addition, the individual sound radiating segments 11' can also be provided with recesses 32 for subdividing low-frequency resonances into a plurality of weaker, mutually detuned resonances. Such a recess is shown on the center segment 11' of FIG. 4. It will be understood that the recess 32 shown in FIG. 4 is not restricted to the illustrated shape or form, but may include other embodiments adapted to different requirements and may have, for example, a wedge or staircase shape.

It is to be understood that the embodiments and variations shown and described above are illustrative of the principles of this invention only and that various modifications may be implemented by those skilled in the art without departing from the scope and spirit of the invention.

What is claimed is:

1. Acoustic wall for radiating sound comprising:

a plurality of sound radiating segments; and at least one connecting element which connects the sound radiating segments with one another at respective marginal edges of the sound radiating segments, wherein the plurality of sound radiating segments form a sound reproduction surface of the acoustic wall.

2. The acoustic wall of claim 1, wherein at least one of the sound radiating segments includes a core layer and at least one cover layer, wherein at least one of the cover layers is connected with a surface of the core layer disposed in the sound reproduction surface, and wherein the at least one connecting element is formed by at least one of the core layer and the cover layers.

3. The acoustic wall of claim 1, wherein a surface area of at least one of the plurality of sound radiating segments is different from a surface area of the other sound radiating segments so as to efficiently radiate a different predetermined acoustic frequency or frequency range.

4. The acoustic wall of claim 3, wherein the surface area of the at least one sound radiating segment is adapted to efficiently radiate sound at a low acoustic frequency and arranged substantially in a center region of the sound reproduction surface.

5. The acoustic wall of claim 4, wherein the at least one sound radiating segment radiating sound at the low acoustic frequency is at least partially surrounded by the other segments.

6. The acoustic wall of claim 1, wherein a depth in a direction parallel to the surface normal of the reproduction surface of at least one of the plurality of sound radiating segments is different from a depth of the other sound radiating segments so as to efficiently radiate a different predetermined acoustic frequency or frequency range.

7. The acoustic wall of claim 2, wherein the at least one sound radiating segment comprises at least one recess which reduces a depth of the core layer of the at least one sound radiating segment in a predetermined region.

8. The acoustic wall of claim 1, wherein the sound reproduction surface facing an audience is provided with a visually recognizable design.

9. The acoustic wall of claim 1, wherein the sound reproduction surface is convex.

10. The acoustic wall of claim 1, wherein the sound reproduction surface is concave.

11. The acoustic wall of claim 1, wherein the at least one connecting element operates as a mechanical filter and controls sound radiating characteristics of the connected sound radiating segments.

12. The acoustic wall of claim 4, wherein the connecting element which connects the at least one sound radiating segment adapted to efficiently radiate sound at a low acoustic frequency with the other segments is dampened so as to be substantially impervious to sound.

13. A method of radiating sound from an acoustic wall, comprising:

providing a plurality of wall segments, wherein at least some of the wall segments are sound radiating segments;

providing at least one connecting element; and connecting at least two of the segments, which include at least one sound radiating segment, with one another at respective marginal edges of the segments using the at least one connecting element to form a sound reproduction surface of the acoustic wall.

14. The method of claim 13, further comprising:

adapting a surface area of the plurality of segments to efficiently radiate a predetermined acoustic frequency or frequency range.

15. The method of claim 13, further comprising:

adapting a depth of the plurality of segments in a direction parallel to the surface normal of the reproduction plane to efficiently radiate a predetermined acoustic frequency range.

16. The method of claim 13, further comprising:

providing a visually recognizable design on a portion of the reproduction surface that faces an audience.

* * * * *